(12) United States Patent
Heo et al.

(10) Patent No.: US 10,163,969 B2
(45) Date of Patent: Dec. 25, 2018

(54) X-RAY SENSOR AND METHOD OF MANUFACTURING THE SAME

(71) Applicants: Rayence Co., Ltd., Gyeonggi-do (KR); VatechEwoo Holdings Co., Ltd., Gyeonggi-do (KR)

(72) Inventors: Sung Kyn Heo, Gyeonggi-do (KR); Ho Seok Lee, Gyeonggi-do (KR)

(73) Assignees: Rayence Co., Ltd., Gyeonggi-do (KR); VATECH EWOO Holdings Co., Ltd., Gyeonggi-do (KR)

(*) Notice: Subject to any disclaimer, the term of this patent is extended or adjusted under 35 U.S.C. 154(b) by 29 days.

(21) Appl. No.: 14/504,502

(22) Filed: Oct. 2, 2014

(65) Prior Publication Data
US 2015/0091113 A1 Apr. 2, 2015

(30) Foreign Application Priority Data
Oct. 2, 2013 (KR) .................. 10-2013-0118006

(51) Int. Cl.
*H01L 27/146* (2006.01)
*H01L 31/0296* (2006.01)
*H01L 31/0304* (2006.01)
*H01L 31/18* (2006.01)

(52) U.S. Cl.
CPC .... *H01L 27/14659* (2013.01); *H01L 27/1469* (2013.01); *H01L 27/14661* (2013.01); *H01L 27/14676* (2013.01); *H01L 27/14694* (2013.01); *H01L 27/14696* (2013.01); *H01L 27/14698* (2013.01); *H01L 31/02963* (2013.01); *H01L 31/03042* (2013.01); *H01L 31/1864* (2013.01); *H01L 31/184* (2013.01); *H01L 31/1828* (2013.01)

(58) Field of Classification Search
CPC .......... H01L 27/14634; H01L 27/1469; H01L 27/14659; H01L 27/14676; H01L 27/14698; H01L 27/14696; H01L 31/02963; H01L 31/1828; H01L 31/1864; H01L 27/14661
See application file for complete search history.

(56) References Cited

U.S. PATENT DOCUMENTS 5,998,794 A * 12/1999 Spivey ................ H01L 27/1465
250/370.09
6,340,812 B1 * 1/2002 Izumi et al. ............... 250/208.1
(Continued)

FOREIGN PATENT DOCUMENTS

JP  2000-156487 A  6/2000
WO  2013/065212 A1  5/2013

*Primary Examiner* — Yu Chen
(74) *Attorney, Agent, or Firm* — IP Legal Services, LLC

(57) ABSTRACT

This invention relates to a direct conversion X-ray sensor and to a method of manufacturing the same. This X-ray sensor includes an array substrate including a pixel electrode formed so as to protrude from a surface thereof at a pixel region; a photoconductive substrate including an upper electrode, and a photoconductive layer formed on a surface of the upper electrode so as to be in contact with the pixel electrode and having a PIN diode structure; and a bonding material filling a space around a contact region of the pixel electrode and the photoconductive layer so as to bond the array substrate and the photoconductive substrate.

3 Claims, 4 Drawing Sheets

(56) References Cited

U.S. PATENT DOCUMENTS

| | | | |
|---|---|---|---|
| 6,344,370 B1* | 2/2002 | Izumi | H01L 27/14609 257/E27.132 |
| 6,350,989 B1* | 2/2002 | Lee | H01L 27/1446 250/370.01 |
| 6,392,217 B1 | 5/2002 | Teranuma et al. | |
| 6,792,217 B2 | 9/2004 | Nishino et al. | |
| 6,798,030 B1 | 9/2004 | Izumi et al. | |
| 2006/0065842 A1* | 3/2006 | Okamura | G01T 1/2928 250/370.09 |

* cited by examiner

X-RAY SENSOR AND METHOD OF MANUFACTURING THE SAME

CROSS REFERENCE TO PRIOR APPLICATIONS

The present application claims priority under 35 U.S.C. § 119 to Korean Patent Application No. 10-2013-0118006 (filed on Oct. 2, 2013), which is hereby incorporated by reference in its entirety.

BACKGROUND OF THE INVENTION

1. Field of the Invention

The present invention relates to an X-ray sensor, and more particularly, to a direct conversion X-ray sensor and a method of manufacturing the same.

2. Description of the Related Art

Typically, medical or industrial X-ray imaging has been performed using films and screens, but is inefficient in terms of cost and time due to the problems of development and storage of the films used.

To solve such problems, thorough research into an imaging system using a digital X-ray sensor is ongoing.

An X-ray sensor may include a direct conversion X-ray sensor and an indirect conversion X-ray sensor. A direct conversion X-ray sensor directly converts X-rays into an electrical signal using a photoconductor, and an indirect conversion X-ray sensor converts X-rays into visible light by a scintillator so that the visible light is converted into an electrical signal using a photovoltaic device.

Compared to an indirect conversion X-ray sensor, a direct conversion X-ray sensor has a good resolution and thus exhibits high definition.

In such a direct conversion X-ray sensor, methods of directly depositing a photoconductor on an array substrate having driving elements for reading out an electrical signal are under study. However, such a direct deposition process is problematic because limitations are imposed on heat resistance of the layers of the array substrate and thus the film formation temperature of the photoconductor is restricted and it is difficult to achieve large-area deposition.

SUMMARY OF THE INVENTION

Accordingly, an object of the present invention is to provide an X-ray sensor and a method of manufacturing the same, wherein problems with a direct deposition process including a limitation in film formation temperature and a difficulty in large-area deposition may be solved.

In order to accomplish the above object, the present invention provides an n X-ray sensor, including: an array substrate including a pixel electrode formed so as to protrude from a surface thereof at a pixel region; a photoconductive substrate including an upper electrode, and a photoconductive layer formed on a surface of the upper electrode so as to be in contact with the pixel electrode and having a PIN diode structure; and a bonding material filling a space around a contact region of the pixel electrode and the photoconductive layer so as to bond the array substrate and the photoconductive substrate.

The photoconductive layer includes at least one selected from among CdTe, CdZnTe, PbO, $PbI_2$, $HgI_2$, GaAs, Se, TlBr and $BiI_3$.

The bonding material is a thermoplastic heat-resistant adhesive material including polyimide (PI) or polybenzimidazole (PBI).

In order to accomplish the above object, the present invention provides a method of manufacturing an X-ray sensor, including: (a) manufacturing an array substrate including a pixel electrode formed so as to protrude from a surface thereof at a pixel region; (b) manufacturing a photoconductive substrate including an upper electrode and a photoconductive layer formed on a surface of the upper electrode; and (c) applying a bonding material on the array substrate or the photoconductive substrate, attaching the array substrate and the photoconductive substrate so that the pixel electrode and the photoconductive layer are in contact, and performing heating and cooling process to bond the array substrate and the photoconductive substrate.

The photoconductive layer comprises at least one selected from among CdTe, CdZnTe, PbO, $PbI_2$, $HgI_2$, GaAs, Se, TlBr and $BiI_3$.

The bonding material is a thermoplastic heat-resistant adhesive material including polyimide (PI) or polybenzimidazole (PBI), and the heating is performed at a temperature equal to or higher than a glass transition temperature of the bonding material.

The heating is performed at 400~600° C.

A PIN diode structure is formed in the photoconductive layer by the heating.

The method also includes applying rapid thermal treatment to the photoconductive layer at 400~600° C. so that the photoconductive layer has a PIN diode structure, after (c).

According to the present invention, a photoconductive layer is formed on a photoconductive substrate, pixel electrodes are provided in the form of a protrusion on an array substrate, and a bonding material is applied between the two substrates and then cured, thereby bonding the photoconductive substrate and the array substrate.

When the photoconductive layer is formed on a separate substrate in this way, there is no need to limit the film formation temperature of a photoconductor and it is possible to effectively cope with manufacturing large-area deposition.

Furthermore, as the two substrates are bonded by curing the bonding material disposed between the pixel electrodes in protrusion form, the additional use of a conductive adhesive or bump can be obviated, and bonding strength and fatigue life of the bonding portion can be enhanced.

Moreover, a PIN diode structure is formed by carrying out a rapid thermal treatment, thereby resulting in increased photoelectric conversion efficiency and decreased leakage current.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Hereinafter, a detailed description will be given of embodiments of the present invention with reference to the appended drawings.

Figure 1:
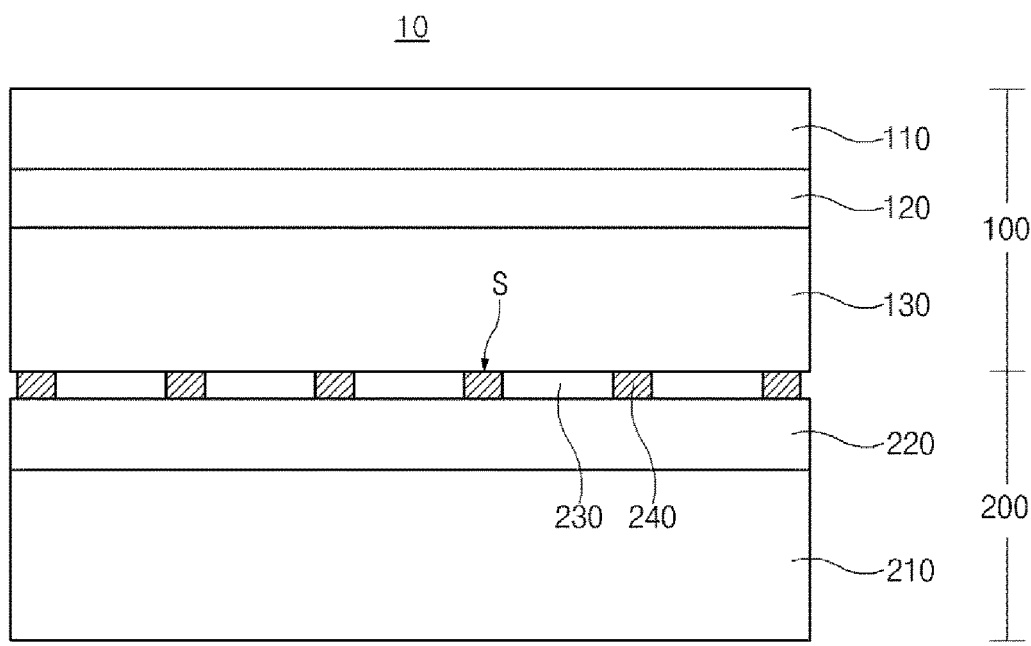
FIG. 1 is a cross-sectional view schematically illustrating an X-ray sensor according to an embodiment of the present invention.

FIG. 1 is a cross-sectional view schematically illustrating an X-ray sensor according to an embodiment of the present invention.

As illustrated in FIG. 1, the X-ray sensor 10 according to an embodiment of the present invention may include a photoconductive substrate 100 having a photoconductive layer 130, and an array substrate 200 having driving elements and pixel electrodes 230.

The array substrate 200 and the photoconductive substrate 100 are separately manufactured and then bonded to each other by a bonding material 240.

The array substrate 200 includes signal wires (not shown) and driving elements (not shown) for reading out an electrical signal photoelectrically converted by the photoconductive layer 130. An example of the array substrate 200 may include a TFT substrate or a CMOS substrate. A CMOS substrate is exemplified in this embodiment. The array substrate 200 may include a second substrate 210 as a base substrate, a driving element layer 220 on a surface of the second substrate 210, and pixel electrodes 230 on a surface of the driving element layer 220.

The second substrate 210 may include a semiconductor substrate, for example, a silicon substrate doped with a P type or N type impurity.

The driving element layer 220 may include driving elements such as transistors for reading out an electrical signal, and a variety of signal wires connected to the driving elements. The driving element layer 220 may include at least one insulating film and at least one metal film.

Although not specifically shown, an edge of the driving element layer 220 may be formed with a pad provided on at least one end of each signal wire. Such a pad is electrically connected to an external driving circuit, and thus may receive a driving signal and may output an image signal.

The pixel electrodes 230 are formed at respective pixel regions disposed in the form of a matrix in the array substrate 200. Particularly in an embodiment of the invention, some or all of the pixel electrodes 230 may be provided in the form of a protrusion toward the photoconductive substrate 100. Thus, these electrodes may come into direct contact with the photoconductive layer 130 of the photoconductive substrate 100 without the additional use of a conductive tape or bump.

The photoconductive substrate 100 that is bonded to the array substrate 200 may include a first substrate 110 serving as a base substrate, an upper electrode 120 on a surface of the first substrate 110, and a photoconductive layer 130 on a surface of the upper electrode 120. The upper electrode 120 is formed on the entire surface of the first substrate 110, and functions as a common electrode.

The photoconductive layer 130 generates an electrical signal of electron/hole pair in response to the X-ray incidence. The electrical signal thus generated is transmitted to the pixel electrodes 230 in contact with the photoconductive layer 130, so that an image signal may be read out per pixel region.

The bonding material 240 for bonding the array substrate 200 and the photoconductive substrate 100 may be provided between the array substrate 200 and the photoconductive substrate 100, namely, around the pixel electrodes 230 between the photoconductive layer 130 and the driving element layer 220. The bonding material 240 may include a curable thermoplastic adhesive material having heat resistance, such as polyimide (PI) or polybenzimidazole (PBI).

As some or all of the pixel electrodes 230 may be provided in the form of a protrusion toward the photoconductive layer 130, a space S between the pixel electrodes 230 may be provided in the form of a recess and may thus be filled with the bonding material 240.

The bonding material filling such a space S may be cured, so that it may be bonded with the pixel electrodes 230 at the outer side thereof and the driving element layer 220 thereunder, and also with the photoconductive layer 130 thereon. Accordingly, the array substrate 200 and the photoconductive substrate 100 may be firmly bonded by the bonding material 240.

The use of the bonding material 240 may result in enhanced bonding strength between the array substrate 200 and the photoconductive substrate 100 and in an increased fatigue life at the bonding portion.

The array substrate 200 and the photoconductive substrate 100, which are bonded to each other, are subjected to rapid thermal treatment (RTP), thus forming a PIN diode structure. RTP may be performed in the course of heating to a temperature equal to or higher than a glass transition temperature of the bonding material 240 after hot pressing of the array substrate 200 and the photoconductive substrate 100 together with the bonding material 240 interposed therebetween to bond the array substrate 200 and the photoconductive substrate 100, or may be separately conducted after bonding of the array substrate 200 and the photoconductive substrate 100.

Figure 2:
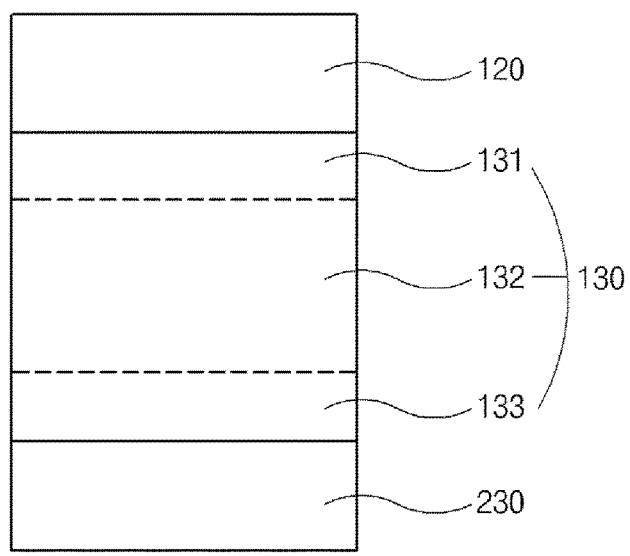
FIG. 2 is a cross-sectional view schematically illustrating a PIN diode structure of the X-ray sensor according to an embodiment of the present invention.

In this regard, FIG. 2 is a cross-sectional view schematically illustrating the PIN diode structure of the X-ray sensor according to an embodiment of the present invention.

As illustrated in FIG. 2, the photoconductive layer 130 that forms the PIN diode structure between the pixel electrodes 230 and the upper electrode 120 may include a P+ type region 131 and an N type region 133 at the upper and the lower position thereof, and an I type region 132 between these regions. In an embodiment of the invention, the use of a P type photoconductive material for the photoconductive layer 130, the P+ type region 131 located toward the upper electrode 120, and the N type region 133 located toward the pixel electrodes 230 are illustrated. Especially, the P type photoconductive material is exemplified by CdTe.

As for formation of the PIN diode structure, the pixel electrodes 230 and the upper electrode 120 may be formed with a metal. One of the pixel electrodes 230 and the upper electrodes may act as an acceptor and the other may act as a donor, based on the semiconductor material of the photoconductive layer 130. In an embodiment of the invention, the pixel electrodes 230 may be formed of a metal material acting as a donor and the upper electrode 120 may be formed of a metal material acting as an acceptor. In particular, the use of Al for the pixel electrodes 230 and Au or Pt for the upper electrode is exemplified.

When RTP is performed, individual metal materials may be diffused by a predetermined depth into the photoconductive layer 130 at the interface between the pixel electrodes 230 and the photoconductive layer 130 and the interface between the upper electrode 120 and the photoconductive layer 130. As such, RTP may be conducted at about 300~700° C. and preferably 400~600° C. for ones of min.

Thereby, the N type region 133 is formed at a position of the photoconductive layer 130 adjacent to the pixel electrodes 230, and the high-concentration P type, namely, the P+ region 131 is formed at a position of the photoconductive layer 130 adjacent to the upper electrode 120. The remainder of the photoconductive layer 130, into which any metal material is not diffused, is maintained in P type, and thereby functions as the I type region 132 in the diode.

When the PIN diode structure is formed in this way, photoelectric conversion efficiency may be increased and leakage current may be lowered.

Below is a description of a method of manufacturing the X-ray sensor according to an embodiment of the present invention, with reference to FIGS. 3 to 6.

FIGS. 3 to 6 are cross-sectional views schematically illustrating a process of manufacturing the X-ray sensor according to an embodiment of the present invention.

The photoconductive substrate 100 and the array substrate 200 are separately manufactured.

Figure 3:
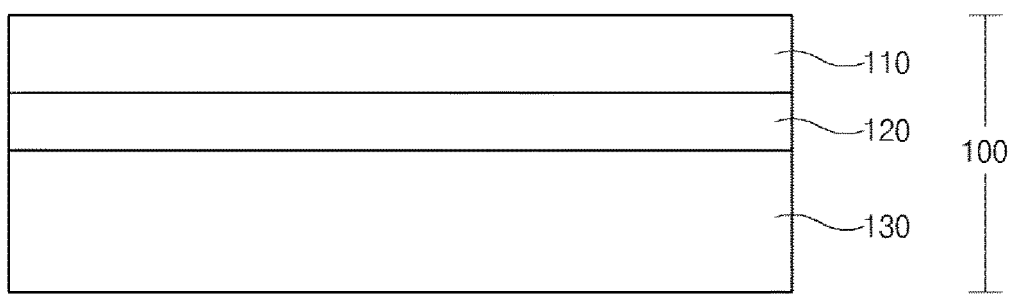
FIGS. 3 to 6 are cross-sectional views schematically illustrating a process of manufacturing the X-ray sensor according to an embodiment of the present invention.

As illustrated in FIG. 3, the upper electrode 120 is formed on a surface of the first substrate 110, and the photoconductive layer 130 is formed on a surface of the upper electrode 120, thus manufacturing the photoconductive substrate 100. The photoconductive layer 130 for converting X-rays into an electrical signal may include at least one selected from among CdTe, CdZnTe, PbO, PbI$_2$, HgI$_2$, GaAs, Se, TlBr and BiI$_3$, but the present invention is not limited thereto.

Figure 4:
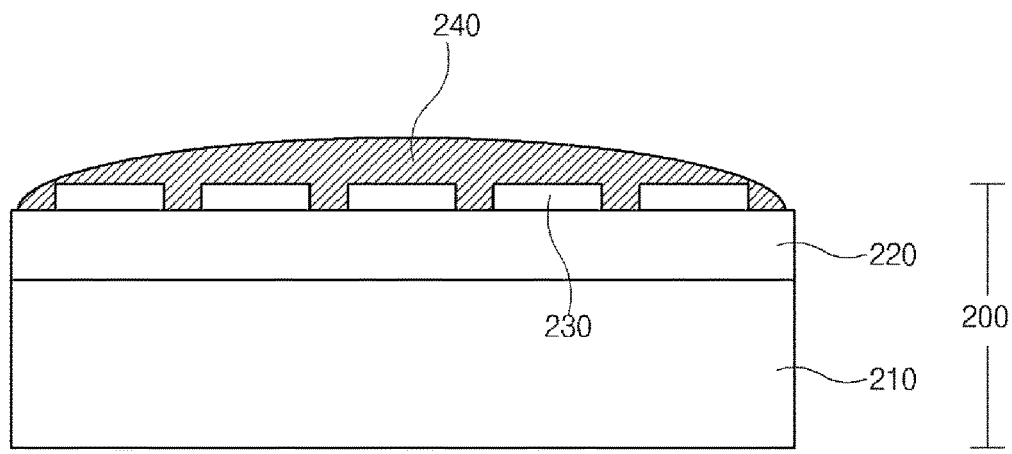

As illustrated in FIG. 4, the driving element layer 220 is formed on a surface of the second substrate 210, and the pixel electrodes 230 are formed at respective pixel regions on a surface of the driving element layer 220, thus manufacturing the array substrate 200. As such, some or all of the pixel electrodes 230 may be provided in the form of a protrusion. For example, some or all of the pixel electrodes 230 may be patterned so as to protrude from the surface of the driving element layer 220 using a photolithography process, or may be attached or transferred so as to protrude from the surface of the driving element layer 220 using an imprinting process. Also, additional projections may be formed on the surfaces of the pixel electrodes 230 using a photolithography process or an imprinting process, if necessary.

The bonding material 240 is coated on the entire surface of the array substrate 200 having the pixel electrodes 230.

The bonding material 240 is selected taking into consideration bondability of the photoconductive substrate 100 and the array substrate 200 and fatigue life of the bonding portion. In this regard, useful as a viscous material that is cured upon cooling after hot pressing treatment at a temperature equal to or higher than a glass transition temperature is a material having heat resistance at a temperature for RTP of the photoconductive layer 130. For example, it may include, but is not limited to, at least one selected from among thermoplastic heat-resistant adhesive materials including PI and PBI.

Although the formation of the bonding material 240 on the array substrate 100 is illustrated as above, the bonding material 240 may be applied on the photoconductive layer 130 of the photoconductive substrate 100.

Figure 5:
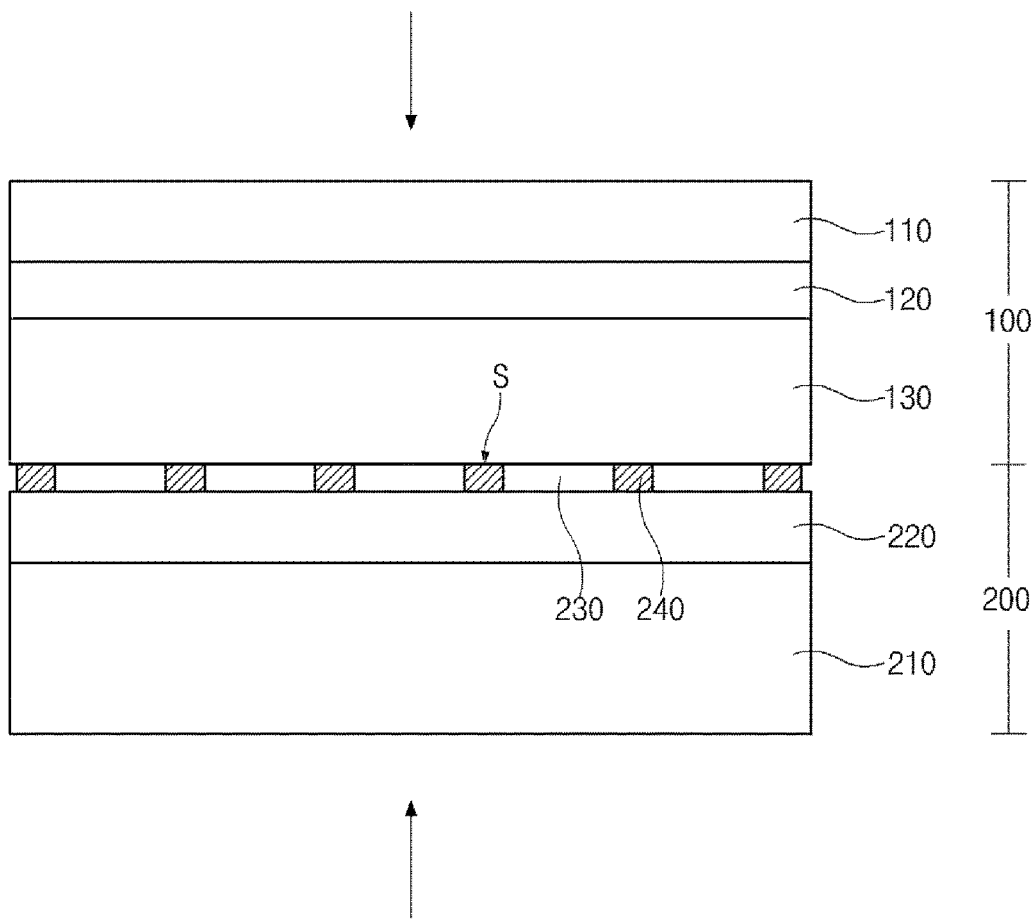
Figure 6:
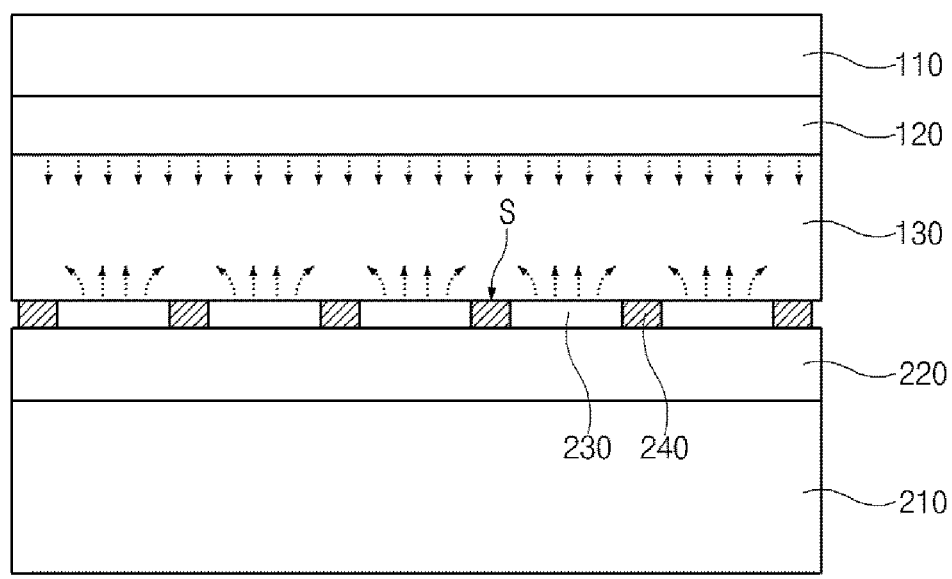

Next, as illustrated in FIG. 5, the photoconductive substrate 100 and the array substrate 200 having the bonding material 240 formed thereon are aligned and attached to each other. Subsequently, while heat is applied to a temperature adapted for the glass transition temperature of the bonding material 240, pressure is applied to the attachment direction of the photoconductive substrate 100 and the array substrate 200. In this procedure, RTP may be simultaneously performed, and thus individual metal materials may be diffused by a predetermined depth into the photoconductive layer 130 at the interface between the pixel electrodes 230 and the photoconductive layer 130 and the interface between the upper electrode 120 and the photoconductive layer 130. The temperature for RTP may be determined in consideration of the glass transition temperature of the bonding material 240 and the diffusion temperature of the pixel electrodes 230 and the upper electrode 120 into the photoconductive layer 130, and may be, for example, 300~700° C., and preferably 400~600° C. for ones of min.

Thereby, as illustrated in FIG. 2, the N type region 133 is formed at a position of the photoconductive layer 130 adjacent to the pixel electrode 230, and the high-concentration P type, namely, the P+ region 131 is formed at a position of the photoconductive layer 130 adjacent to the upper electrode 120. The remainder of the photoconductive layer 130, into which any metal material is not diffused, is maintained in P type, and ultimately functions as the I type region 132.

When the PIN diode structure is formed in this way, photoelectric conversion efficiency may be increased and leakage current may be decreased.

Next, cooling is performed so as to be adapted for the curing of the bonding material 240, and thereby the bonding material 240 is cured with filling a space S around the contact region of the pixel electrodes 230 and the photoconductive layer 130. Accordingly, the photoconductive substrate 100 and the array substrate 200 are physically bonded to each other.

Next, RTP may be additionally performed on the X-ray sensor 10 comprising the photoconductive substrate 100 and the array substrate 200 bonded to each other, if necessary.

Additional RTP may be conducted at 400~600° C. for ones of min.

By the manufacturing procedures as above, the X-ray sensor 10 according to the embodiment of the present invention may be manufactured.

As mentioned above, in the embodiment of the present invention, the photoconductive layer is formed on the photoconductive substrate, and the pixel electrodes may be provided in the form of a protrusion on the array substrate, and the bonding material may be filled between the two substrates and then cured, so that the photoconductive substrate and the array substrate are bonded to each other.

According to the embodiment of the present invention, it is not required to consider the temperature constraint for forming the film of the photoconductor, and it is possible to manufacture large-area sensor effectively.

Also, when the two substrates are bonded by curing the bonding material disposed between the pixel electrodes in protrusion form, there is no need to use a conductive adhesive or bump, and bonding strength and fatigue life of the bonding portion may be enhanced.

Furthermore, it is possible to form a PIN diode structure by applying the RTP. Thus, the photoelectric conversion efficiency may be increased and leakage current may be decreased.

Although the X-ray sensor using the photoconductor is mainly described as above, the corresponding photoconductor structure may be applied to other photovoltaic devices such as solar cells, etc.

Although the preferred embodiments of the present invention have been disclosed for illustrative purposes, those skilled in the art will appreciate that various modifications, additions and substitutions are possible, without departing from the scope of the invention as disclosed in the accompanying claims.

What is claimed is:

1. An X-ray sensor, comprising:
   an array substrate including a plurality of pixel electrodes protruding from a surface thereof at a pixel region wherein the pixel electrodes include a first metal, and wherein each of the plurality of pixel electrodes is a unitary structure;

a photoconductive substrate including an upper electrode including a second metal, and a photoconductive layer formed on a surface of the upper electrode so as to be in direct contact with the pixel electrodes and having a PIN diode structure; and a bonding material formed between adjacent pixel electrodes of the array substrate to fill spaces between adjacent pixel electrodes, and wherein a height level of the bonding material is level with a height of the plurality of pixel electrodes, wherein the PIN diode structure includes a first material diffused from the upper electrode and a second material diffused from the pixel electrode, and wherein the first diffused material and the second diffused material act as an acceptor and donor, respectively.

2. The X-ray sensor of claim 1, wherein the photoconductive layer includes at least one selected from among CdTe, CdZnTe, PbO, $PbI_2$, $HgI_2$, GaAs, Se, TlBr and $BiI_3$.

3. The X-ray sensor of claim 1, wherein the bonding material is a thermoplastic heat-resistant adhesive material including polyimide (PI) or polybenzimidazole (PBI).

* * * * *